(12) United States Patent
Kim et al.

(10) Patent No.: US 11,889,733 B2
(45) Date of Patent: Jan. 30, 2024

(54) DISPLAY DEVICE WITH ADHESIVE LAYER HAVING A LOW STORAGE MODULUS

(71) Applicant: SAMSUNG DISPLAY CO., LTD., Yongin-si (KR)

(72) Inventors: Young Do Kim, Cheonan-si (KR); Jin Ho Ju, Seoul (KR); Jang Doo Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 312 days.

(21) Appl. No.: 17/036,237

(22) Filed: Sep. 29, 2020

(65) Prior Publication Data

US 2021/0193743 A1 Jun. 24, 2021

(30) Foreign Application Priority Data

Dec. 18, 2019 (KR) .......................... 10-2019-0169823

(51) Int. Cl.
*H10K 59/38* (2023.01)
*H10K 50/86* (2023.01)
*H10K 50/842* (2023.01)
*H10K 59/40* (2023.01)

(52) U.S. Cl.
CPC ......... *H10K 59/38* (2023.02); *H10K 50/8426* (2023.02); *H10K 50/865* (2023.02); *H10K 59/40* (2023.02)

(58) Field of Classification Search
CPC .. H01L 27/322; H01L 27/323; H01L 51/5246
See application file for complete search history.

(56) References Cited

U.S. PATENT DOCUMENTS

| 8,664,021 | B2 | 3/2014 | Kim et al. | |
| 2018/0197921 | A1* | 7/2018 | Kim | G06F 3/0412 |
| 2019/0243041 | A1* | 8/2019 | Takarada | G02B 5/3033 |
| 2020/0033673 | A1* | 1/2020 | Fujita | C09J 7/385 |
| 2021/0296543 | A1* | 9/2021 | Aoyama | H01L 25/0753 |
| 2022/0274376 | A1* | 9/2022 | Tabata | B32B 27/308 |

FOREIGN PATENT DOCUMENTS

| KR | 20160082760 | 7/2016 |
| KR | 101680765 | 11/2016 |
| KR | 101803991 | 12/2017 |
| KR | 20180018969 | 2/2018 |
| KR | 20180063960 | 6/2018 |
| KR | 20180092326 | 8/2018 |

OTHER PUBLICATIONS

Byeong-Kwan An, et al., Enhanced Emission and Its Switching in Fluorescent Organic Nanoparticles, pp. 14410-14415, J. Am. Chem. Soc. 2002.

* cited by examiner

*Primary Examiner* — Nduka E Ojeh
(74) *Attorney, Agent, or Firm* — F. CHAU & ASSOCIATES, LLC

(57) ABSTRACT

A display device according to an embodiment includes: a substrate; a light emitting diode; an input sensing member disposed on the light emitting diode; a color conversion layer and a light blocking member disposed on the input sensing member; an adhesive layer disposed on the color conversion layer and the light blocking member; and a window bonded to the adhesive layer, wherein a storage modulus of the adhesive layer may be 0.2 MPa or less at −20° C., and a glass transition temperature (Tg) of the adhesive layer may be −30° C. or less.

16 Claims, 14 Drawing Sheets

DISPLAY DEVICE WITH ADHESIVE LAYER HAVING A LOW STORAGE MODULUS

CROSS-REFERENCE TO RELATED APPLICATION

This application claims priority under 35 U.S.C. § 119 from, and the benefit of, Korean Patent Application No. 10-2019-0169823, filed in the Korean Intellectual Property Office on Dec. 18, 2019, the contents of which are herein incorporated by reference in their entirety.

BACKGROUND

(a) Technical Field

Embodiments of the present disclosure are directed to a display device.

(b) Discussion of the Related Art

Recently, electronic devices that can be bent or folded have been actively developed. Such a flexible electronic device includes an electronic panel such as a flexible display panel or a flexible touch panel, and various other members. The other members have different functions. The other members are disposed on at least one of the side surfaces of the electronic device.

The other members can be curved, bent, or folded with the electronic device. The other members are relatively flexible, so that they can be curved, bent, or folded.

SUMMARY

Embodiments provide a display device that has improved reliability and flexibility.

A display device according to an embodiment includes: a light emitting diode; an input sensing member disposed on the light emitting diode; a color conversion layer and a light blocking member disposed on the input sensing member; an adhesive layer disposed on the color conversion layer and the light blocking member; and a window bonded to the adhesive layer. A storage modulus of the adhesive layer may be 0.2 MPa or less at −20° C., and a glass transition temperature (Tg) of the adhesive layer may be −30° C. or less.

The display device may include a red emission region, a green emission region, and a blue emission region.

The color conversion layer may include a red color conversion layer that overlaps the red emission region, and a green color conversion layer that overlap the green emission region.

The red color conversion layer and the green color conversion layer may respectively include at least one of quantum dots or a solid fluorescent dye.

The adhesive layer may contact the input sensing member in the blue emission region. The adhesive layer may contact the red color conversion layer in the red emission region, and the adhesive layer may contact the green color conversion layer in the green emission region.

The display device may further include a substrate; a circuit part disposed on the substrate, where the light emitting diode may be disposed on the circuit part; and an encapsulation layer disposed on the light emitting diode and the circuit part, where the input sensing member may be disposed on the encapsulation layer. The substrate may be flexible.

The display device may further include a transparent layer disposed in the blue emission region.

The adhesive layer may contact upper surfaces of the color conversion layer and the transparent layer.

The display device may further include an overcoat layer that overlaps the blue emission region.

The overcoat layer may contact the input sensing member, and the adhesive layer may be disposed between the overcoat layer and the window.

The color conversion layer may further include a blue color conversion layer that overlaps the blue emission region.

The blue color conversion layer may include at least one of quantum dots or a solid fluorescent dye, and the light emitting diode may emit ultraviolet light.

A display device according to another embodiment includes: an encapsulation layer; a color conversion layer and a light blocking member disposed on the encapsulation layer; an adhesive layer disposed on the color conversion layer and the light blocking member; and a window bonded to the adhesive layer. The adhesive layer may include at least one of methyl methacrylate, styrene, vinyltoluene, methyl acrylate, ethyl acrylate, butyl acrylate, 2-ethylhexyl acrylate, lauryl methacrylate, acrylamide, N-methyl acrylamide, hydroxyalkyl acrylate, glycidyl methacrylate, acrylic acid, methacrylic acid, itaconic acid, or maleic anhydride, and the adhesive layer may contact the color conversion layer and the light blocking member.

A storage modulus of the adhesive layer may be 0.2 MPa or less at −20° C., and a glass transition temperature (Tg) of the adhesive layer may be −30° C. or less.

An adhesive force of the adhesive layer may be 600 gf/in or more, a transmittance of the adhesive layer may be 90% or more, and a haze value of the adhesive layer may be 5% or less.

The display device may include a red emission region, a green emission region, and a blue emission region, and the color conversion layer may include a red color conversion layer that overlaps the red emission region and a green color conversion layer that overlaps the green emission region.

The display device may further include an input sensing member disposed between the encapsulation layer and the color conversion layer, and the adhesive layer may contact the input sensing member in the blue emission region.

The adhesive layer may contact the red color conversion layer in the red emission region, and the adhesive layer may contact the green color conversion layer in the green emission region.

The display device may further include a substrate; and a circuit part and a light emitting diode disposed on the substrate. The encapsulation layer may be disposed on the circuit part and the light emitting diode.

A display device according to another embodiment includes: a light emitting diode; a color conversion layer and a light blocking member disposed on the light emitting diode, wherein the display device includes a red emission region, a green emission region, and a blue emission region; an adhesive layer disposed on the color conversion layer and the light blocking member; and a window bonded to the adhesive layer. An adhesive force of the adhesive layer is 600 gf/in or more, a transmittance of the adhesive layer is 90% or more, and a haze value of the adhesive layer is 5% or less.

According to the embodiments, it is possible to provide a display device that has improved reliability through improved adhesion or improved flexibility through an adhesive layer having a low storage modulus.

DETAILED DESCRIPTION OF EXEMPLARY EMBODIMENTS

Figure 1:
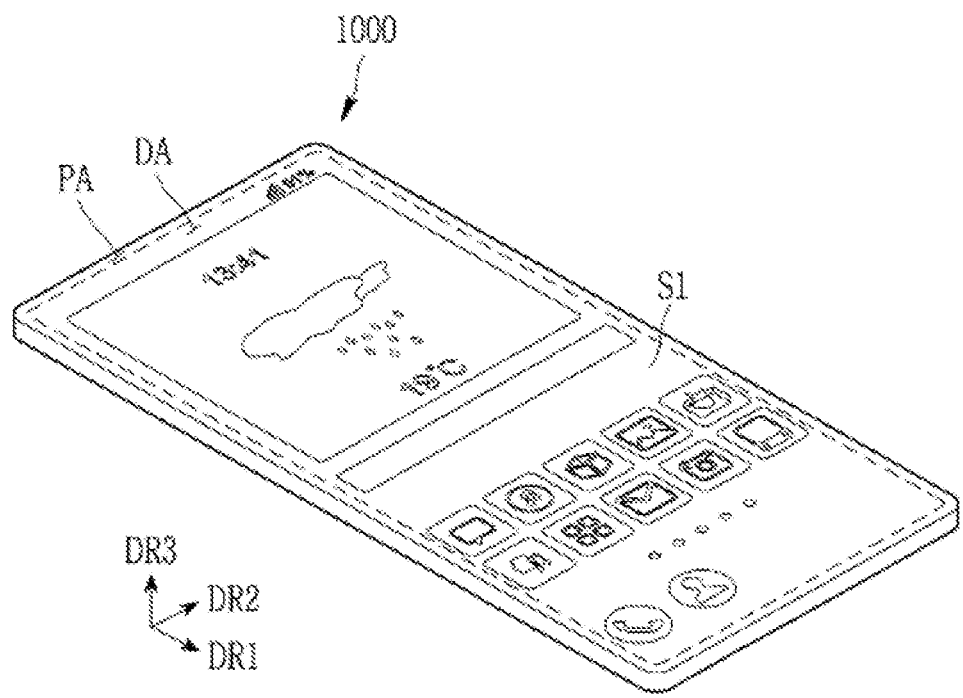
FIG. 1 is a perspective view of a display device according to an embodiment.

Embodiments of the present disclosure will be described more fully hereinafter with reference to the accompanying drawings, in which exemplary embodiments of the disclosure are shown. As those skilled in the art would realize, exemplary embodiments may be modified in various different ways, all without departing from the spirit or scope of the present disclosure.

Further, in the drawings, the size and thickness of each element may be arbitrarily illustrated for ease of description, and the present disclosure is not necessarily limited to those illustrated in the drawings. In the drawings, the thicknesses of layers, films, panels, areas, regions, etc., may be exaggerated for clarity, and like reference numerals may designate like elements throughout the specification.

It will be understood that when an element such as a layer, film, region, or substrate is referred to as being "on" another element, it can be directly on the other element or intervening elements may also be present.

Hereinafter, a display device according to an embodiment will be described with reference to FIG. 1 and FIG. 2. FIG. 1 is a perspective view of a display device according to an embodiment, and FIGS. 2A, 2B, 2C, 2D, 2E, 2F, and 2G are perspective views of a display device shown in FIG. 1 that is folded or rolled.

First, according to an embodiment, referring to FIG. 1, a display device 1000 includes a display area DA that displays an image on one surface S1, and a peripheral area PA that surrounds the display area DA. The peripheral area PA is an area where no image is displayed, and shapes of the display area DA and the peripheral area PA may be relatively changed. In some embodiments, the peripheral area PA is substantially omitted. In the present specification, FIG. 1 illustrates icons and a clock window of an application as an example, and the display area DA has a rectangular shape. The surface is parallel to a plane defined by a first direction DR1 and a second direction DR2 that crosses the first direction, and display an image in a third direction DR3 that is normal to the plane of the first and second directions DR1, DR2.

According to an embodiment, the display device 1000 may be a foldable display device, a rollable display device, a bendable display device, or a stretchable display device. The display device 1000 according to an embodiment can be used in a large electronic device such as a television, a monitor, etc., or in small or medium electronic devices such as a mobile phone, a tablet, a car navigation device, a game machine, a smart watch, etc.

Figure 2A:
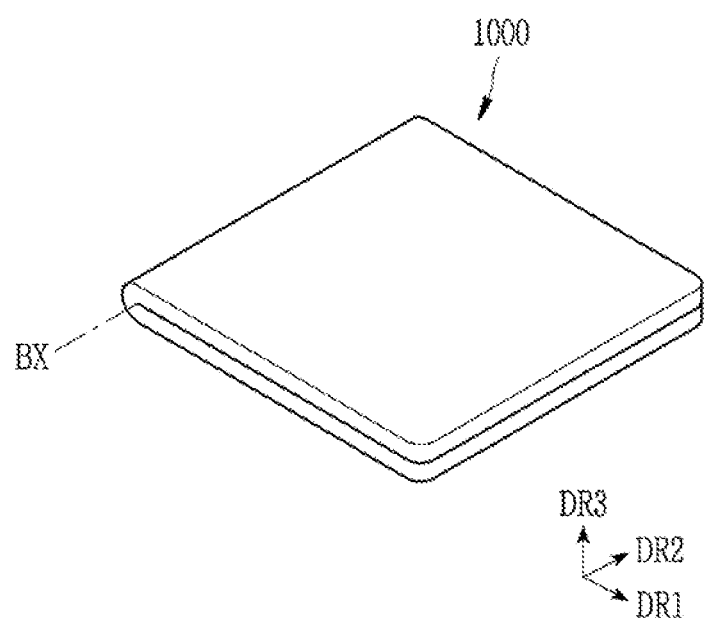
FIGS. 2A, 2B, 2C, 2D, 2E, 2F, and 2G are perspective views of a display device shown in FIG. 1 that is folded or rolled.

Hereinafter, referring to FIG. 1 and FIG. 2A, the display device 1000 is in-folded around a bending axis BX parallel to the second direction DR2.

As the display device 1000 according to an embodiment is in-folded around the bending axis BX, the first surface S1 of the display device 1000 is folded around the bending axis BX, so that the first surface S1 of the display device 1000 is divided by the bending axis BX and is folded to face itself, and a rear surface of the display device 1000 that is opposite to the first surface S1 is externally exposed.

Figure 2B:
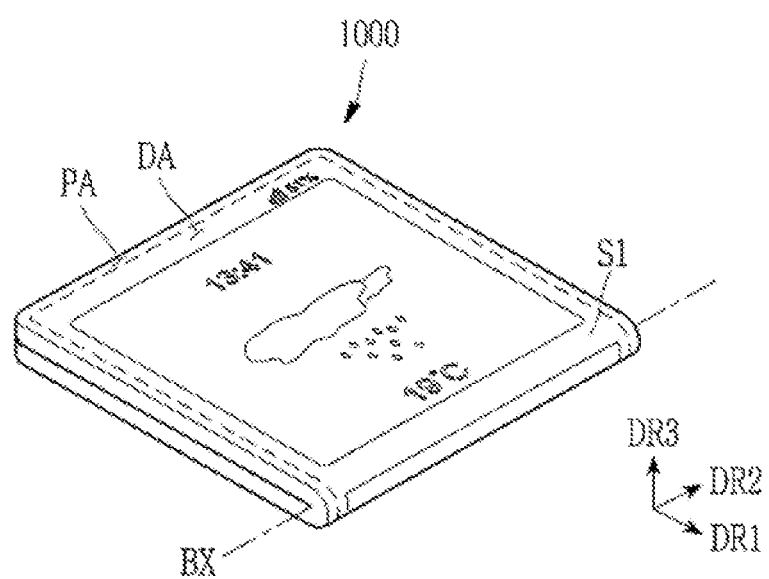

Referring to FIG. 2B, according to an embodiment, the display device 1000 is out-folded around the bending axis BX parallel to the second direction DR2. As the display device 1000 according to an embodiment is out-folded around the bending axis BX, the first surface S1 of the display device 1000 is externally exposed, and a rear surface opposite to the first surface S1 is folded inward around the bending axis BY, so that both sides of the rear surface are divided by the bending axis BY and face each other.

Figure 2C:
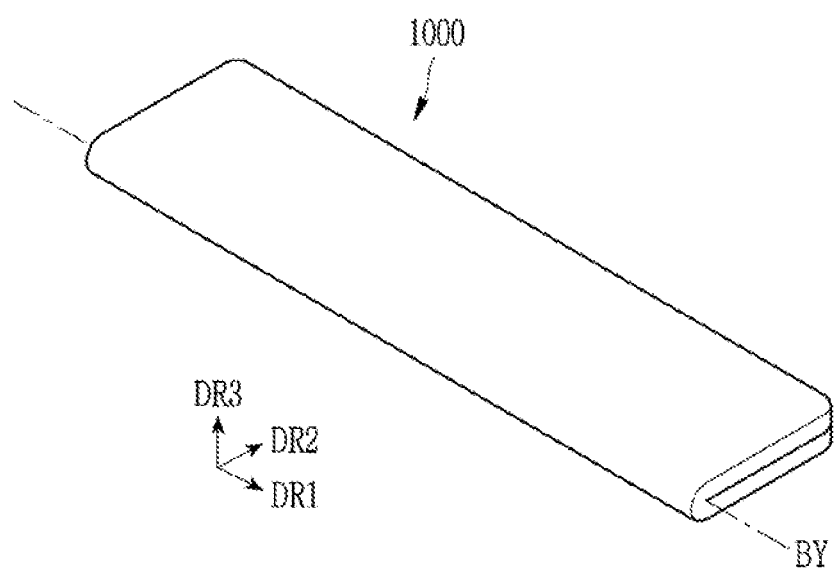

Referring to FIG. 1 and FIG. 2C, according to an embodiment, the display device 1000 is in-folded around a bending axis BY parallel to the first direction DR1. As the display device 1000 according to an embodiment is in-folded around the bending axis BY, the first device S1 of the display device 1000 is folded to face itself, and a rear surface that faces the first surface S1 is externally exposed.

Figure 2D:
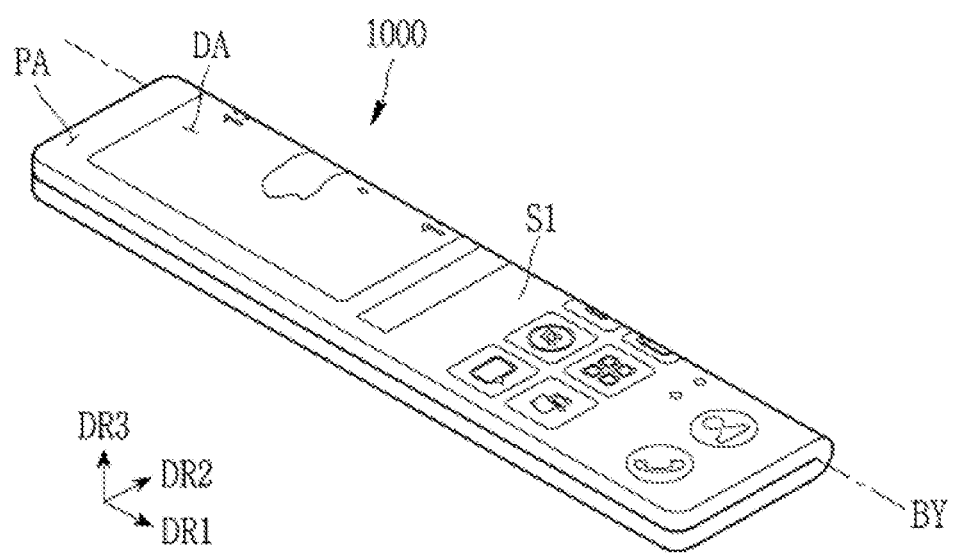

Referring to FIG. 2D, the display device 1000 according to an embodiment is out-folded around the bending axis BY parallel to the first direction DR1. As the display device 1000 according to an embodiment is out-folded around the bending axis BY, the first surface S1 of the display device 1000 is externally exposed, and a rear surface that faces the first surface S1 is folded around the bending axis BX, so that both sides of the rear surface are divided by the bending axis BX and face each other.

Figure 2E:
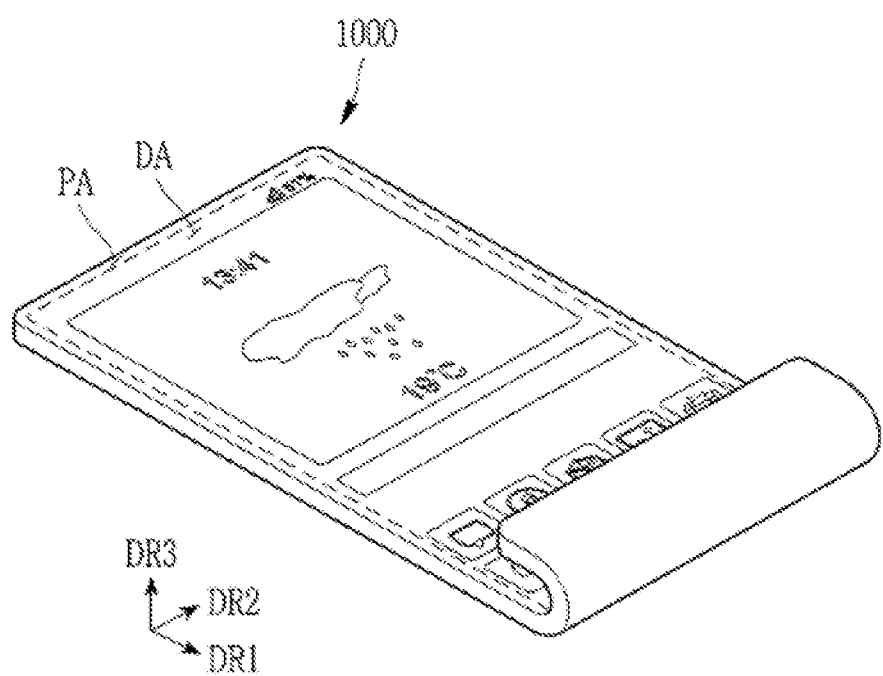
Figure 2F:
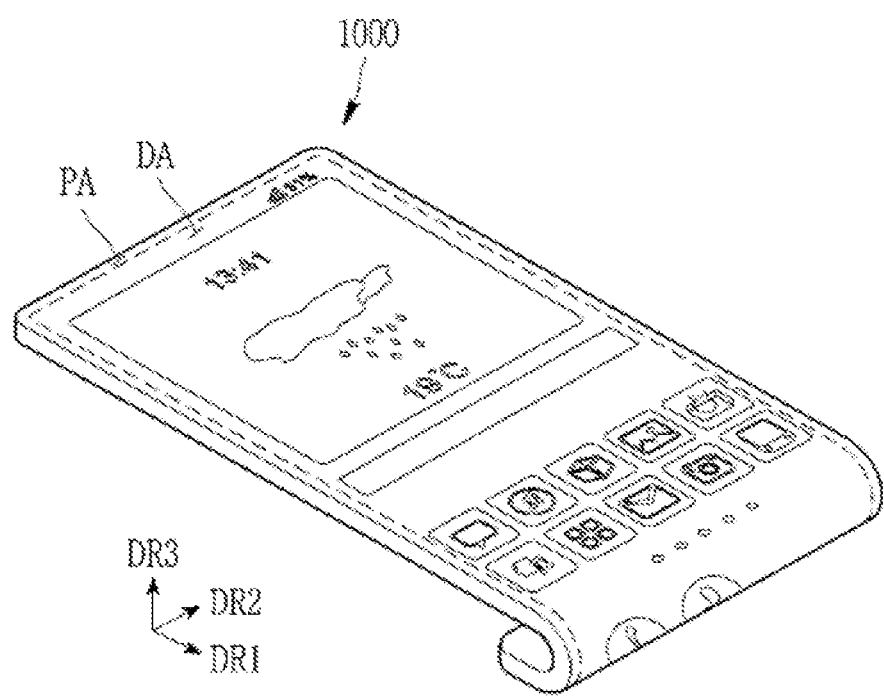
Figure 2G:
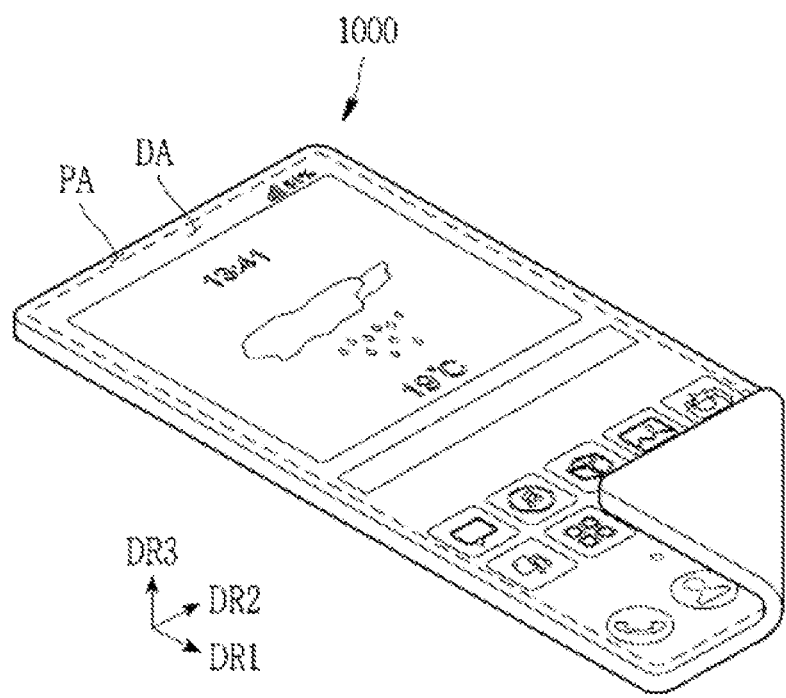

Referring to FIG. 2E to FIG. 2G, the display device 1000 according to an embodiment can be folded or rolled in various ways. As shown in FIG. 2E, the display device 1000 according to an embodiment may be rolled or folded inward from an end portion thereof. In addition, as shown in FIG. 2F, the display device 1000 according to an embodiment may be rolled or folded outward from an end portion thereof. As shown in FIG. 2G, the display device 1000 according to the embodiment may be rolled or folded in a diagonal direction. FIG. 2A to 2G illustrate rolled or folded states of the display device 1000 as examples, however, embodiments of the present disclosure are not limited thereto, and in other embodiments, the display device 1000 can be folded or rolled in various other ways.

Figure 3:
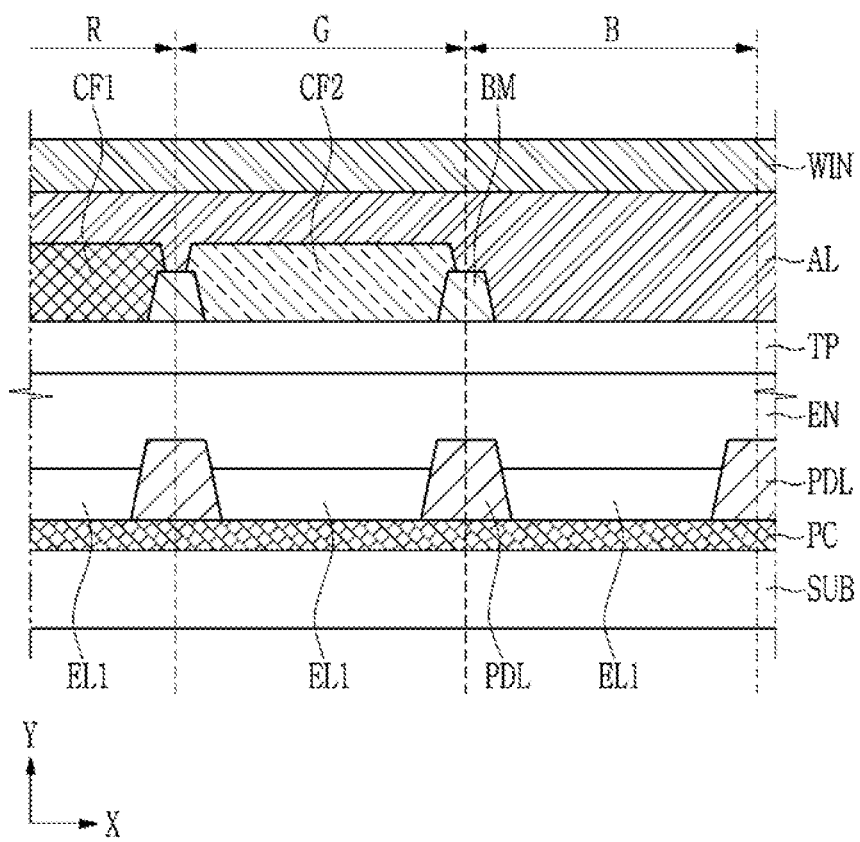
FIG. 3 is a cross-sectional view of a display device according to an embodiment.
Figure 4:
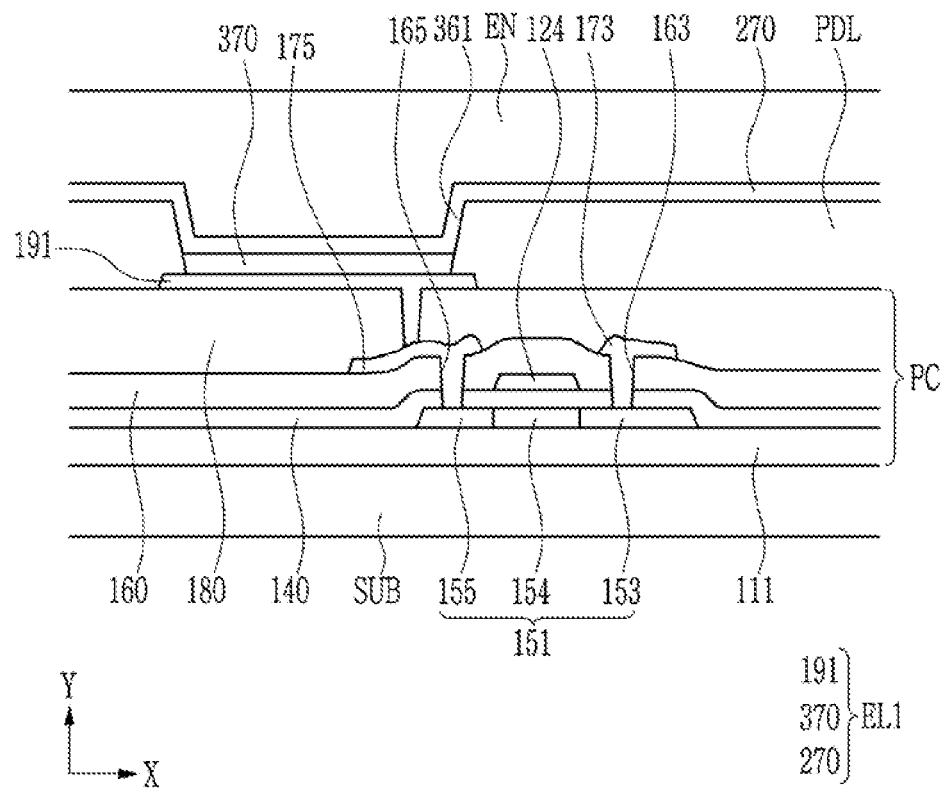
FIG. 4 is a cross-sectional view of a stacked structure of a circuit part according to an embodiment.
Figure 5:
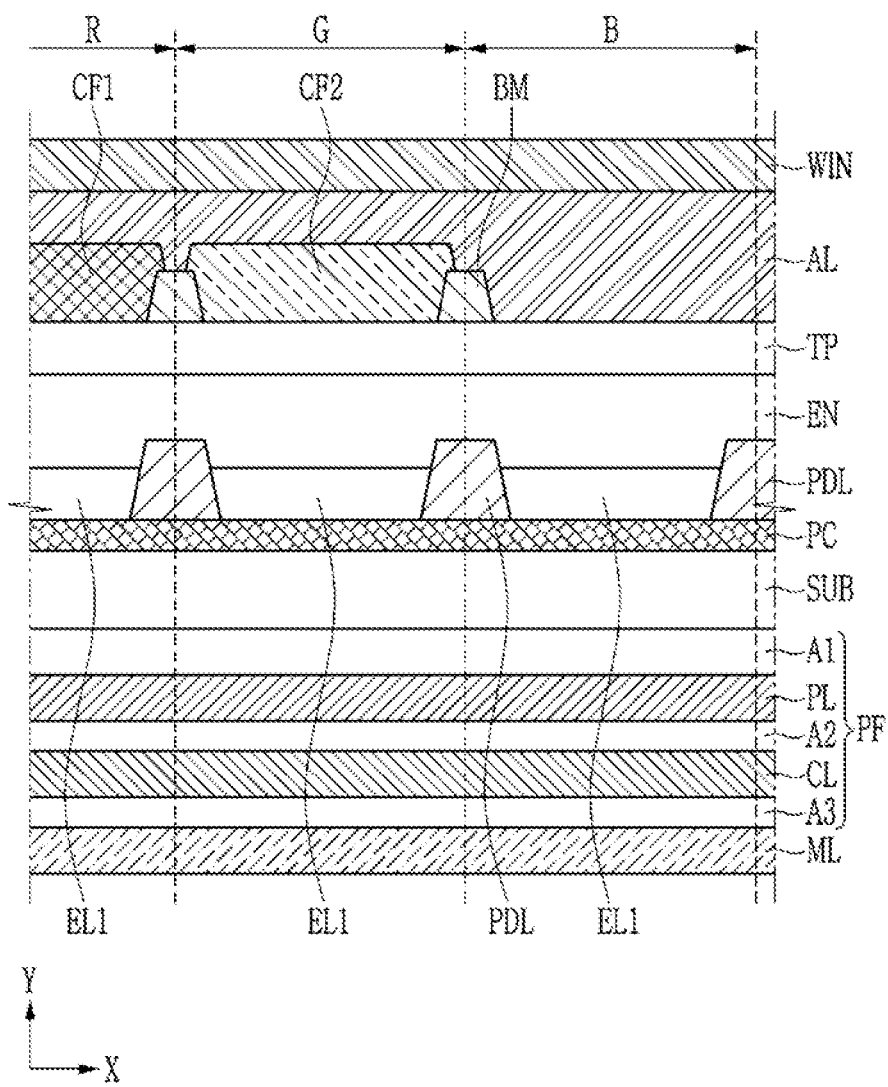
FIG. 5 is a cross-sectional view of a display device according to an embodiment.

Hereinafter, a display device according to an embodiment will be described with reference to FIG. 3 to FIG. 5. FIG. 3 is a cross-sectional view of a display device according to an embodiment, FIG. 4 is a cross-sectional view of a stacked structure of a circuit part according to an embodiment, and FIG. 5 is a cross-sectional view of a display device according to an embodiment.

First, referring to FIG. 3, the display device according to an embodiment includes: a circuit part PC stacked on a substrate SUB; a first light emitting diode EL1 electrically connected to the circuit part PC; an encapsulation layer EN disposed on the first light emitting diode EL1; an input sensing member TP disposed on the encapsulation layer EN; color conversion layers CF1 and CF2, a light blocking member BM, an adhesive layer AL disposed on the input sensing member TP; and a window WIN on the adhesive layer AL.

According to embodiments, the substrate SUB may be a glass substrate or a plastic substrate, and may be flexible.

In an embodiment, the circuit part PC disposed on the substrate SUB includes a plurality of transistors. The circuit part PC is connected to the first light emitting diode EL1 to be described below, and will be described in detail below with reference to FIG. 4.

In an embodiment, the first light emitting diode EL1 is electrically connected to the circuit part PC. The first light emitting diode EL1 includes a pixel electrode, a light emitting layer, and a common electrode. Holes and electrons are injected into the light emitting layer from the pixel electrode and the common electrode, respectively, and combine to form excitons, which are excited states, and light is emitted when the excitons decay from an excited state back to a ground state. The first light emitting diode EL1 according to an embodiment emits blue light, and for example, the first light emitting diode EU emits light having a wavelength in a range from 425 nm to 475 nm.

In an embodiment, a partition wall PDL is disposed between adjacent first light emitting diodes EL1. The partition wall PDL partitions a red emission region R, a green emission region G, and a blue emission region B.

In an embodiment, the encapsulation layer EN is disposed on the first light emitting diode EL1 and the partition wall PDL. The encapsulation layer EN may include a single inorganic layer, a single organic layer, a plurality of inorganic layers, and a plurality of organic layers, or it may have a structure in which an inorganic layer and an organic layer are alternately stacked. In an embodiment, the encapsulation layer EN has a structure in which an organic layer is stacked between two inorganic layers, or a structure in which an organic layer, an inorganic layer, an organic layer, and an inorganic layer are sequentially stacked.

In an embodiment, the input sensing member TP is disposed on the encapsulation layer EN. The input sensing member TP can sense an externally applied touch and generates an electrical signal. The touch may be one of various forms of external input, such as a body contact/adjacency, a conductive object contact/adjacency, light, heat, pressure, etc. The input sensing member TP includes sensors that sense various inputs, such as a conductive sensor, an optical sensor, or a thermal sensor. The input sensing member TP can sense an applied touch by a capacitive method or a pressure sensing method.

The input sensing member TP according to an embodiment has a structure in which an organic film, an input sensing electrode, and an organic film are sequentially stacked, but embodiments are not limited thereto, and in other embodiments, the input sensing member TP has various other stacked structures.

The input sensing member TP according to an embodiment is integrally formed on the encapsulation layer EN through a continuous process. In this case, the input sensing member TP is referred to as an input sensing unit or an input sensing circuit.

In addition, according to an embodiment, an optical member is further disposed between the input sensing member TP and the encapsulation layer EN. The optical member reduces reflectance of incident light from a front surface of the optical member, or improves transmittance of light incident on a rear surface of the optical member. The optical member includes at least one of a polarizing film, an anti-reflection film, a retardation film, or an anti-scattering film.

A display device according to an embodiment includes a red emission region R, a green emission region G, and a blue emission region B. The red emission region R the green emission region G, and the blue emission region B are partitioned by the light blocking member BM.

A display device according to an embodiment includes color conversion layers CF and CF2 that respectively overlap the red emission region R and the green emission region G, and the adhesive layer AL that overlaps the blue emission region B.

In an embodiment, the color conversion layers CF1 and CF2 include a red color conversion layer CF1 and a green color conversion layer CF2. The red color conversion layer CF1 overlaps the red emission region R, and converts blue light emitted from the first light emitting diode EL1 into red light and emits it. The green color conversion layer CF2 overlaps the green emission region C, and converts blue light emitted from the first light emitting diode EL1 into green light and emits it.

In an embodiment, each of the red color conversion layer CF1 and the green color conversion layer CF2 is formed of a photosensitive resin composition, and, for example, may include a material that is formed through a low temperature curing process. In addition, each of the red color conversion layer CF1 and the green color conversion layer CF2 includes at least one of quantum dots or a solid fluorescent dye.

In an embodiment, the quantum dots included in the red color conversion layer CF1 and the green color conversion layer CP2 are independently selected from a Group II-VI compound, a Group III-V compound, a Group IV-VI compound, a Group 1V element, a Group IV compound, or a combination thereof.

In an embodiment, the Group II-VI compound may be one of a two-element compound, a three-element compound, or a four-element compound. The two-element compound is selected from CdSe, CdTe, ZnS, ZnSe, ZnTe, Zno, HgS, HgSe, HgTe, MgSe, MgS, or a mixture thereof; the three-element compound is selected from AgInS, CuInS, CdSeS, CdSeTe, CdSTe, ZnSeS, ZnSeTe, ZnSeTe, HgSeS, HgSeTe, HgSeTe, CdZnS, CdZnSe, CdZnTe, CdHgS, CdHgSe, CdHgTe, HgZnS, HgZnSe, HgZnTe, MgZnSe, MgZnS, or a mixture thereof; and the four-element compound is selected from HgZnTeS, CdZnSeS, CdZnSeTe, CdZnSTe, CdHgSeS, CdHgSeTe, CdHgSTe, HgZnSeS, HgZnSeTe, HgZnSTe, or a mixture thereof.

In an embodiment, the Group III-V compound may be one of a two-element compound, a three-element compound, or a four-element compound. The two-element compound is selected from GaN, GaP, GaAs, GaSb, AlN, AlP, AlAs, AlSb, InN, InP, InAs, InSb, or a mixture thereof; the three-element compound is selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, or a mixture thereof; and the four-element compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a mixture thereof.

In an embodiment, the Group IV-VI compound may be one of a two-element compound, a three-element compound, or a four-element compound. The two-element compound is selected from SnS, SnSe, SnTe, PbS, PbSe, PbTe, or a mixture thereof; the three-element compound is selected from SnSeS, SnSeTe, SnSTe, PbSeS, PbSeTe, PbfTe, SnPbS, SnPbSe, SnPbTe, or a mixture thereof; and the four-element compound is selected from SnPbSSe, SnPbSeTe, SnPbSTe, or a mixture thereof. The Group IV element is selected from Si, Ge, or a mixture thereof. The Group IV compound is a two-element compound selected from SiC, SiGe, or a mixture thereof.

In an embodiment, quantum dot particles have a two-element compound, a three-element compound, or a four-element compound at uniform concentrations, or the quantum dot particles may be divided into regions having partially different concentrations. In addition, a core/shell structure in which some quantum dots enclose some other quantum dots is possible. An interface between the core and the shell has a concentration gradient in which a concentration of elements of the shell decreases closer to its center.

In some embodiments, the quantum dots have a core-shell structure that includes a core that with the nanocrystal described above and a shell that surrounds the core. The shell of the quantum dot may be a passivation layer that maintains a semiconductor characteristic, or may be a charging layer that applies electrophoretic characteristics to the quantum dots by preventing chemical denaturation of the core. The shell may be a single layer or have multiple layers. An exemplary quantum shell may include a metal or non-metal oxide, a semiconductor compound, or a combination thereof.

For example, according to an embodiment, the metal or nonmetal oxide is a two-element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, etc., or a three-element compound such as $MgAl_2O_4$, $CoFe_2O_4$, $NiFe_2O_4$, or $CoMn_2O_4$, etc., but embodiments of the present disclosure are not limited thereto.

In addition, according to an embodiment, the semiconductor compound is one of CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb, etc., but embodiments of the the present disclosure are not limited thereto.

In an embodiments, the quantum dot has a full width at half maximum (FWHM) of the light-emitting wavelength spectrum that is equal to or less than about 45 nm, or equal to or less than about 40 nm, or equal to or less than about 30 nm, and in this range, color purity or color reproducibility is improved. In addition, since light emitted by the quantum dot is emitted in all directions, a viewing angle of light is improved.

Further, according to an embodiment, a shape of the quantum dot is not particularly limited, and may be a spherical, pyramidal, or multi-arm shape, or may be a cubic nanoparticle, a nanotube, a nano-wire, a nano-fiber, or a nano-plate particle, etc.

In an embodiment, a quantum dot control a color of emitted light depending on a particle size thereof, and thus a quantum dot can emit light of various colors, such as blue, red, or green.

According to an embodiment, each of the red color conversion layer CF1 and the green color conversion layer CF2 that include quantum dots further includes a scatterer. The scatterers increase an amount of light emitted through the color conversion layers CF1 and CF2 and provide uniform front and side brightness. The scatterer can include any material that can evenly scatter the incident light. For example, the scatterer may include at least one of $TiO_2$, $ZrO_2$, $Al_2O_3$, $In_2O_3$, ZnO, $SnO_2$, $Sb_2O$, or ITO.

In an embodiment, the solid fluorescent dye in the red color conversion layer CF1 absorbs light in a wavelength range from 425 nm to 475 nm, and emits light in a wavelength range from 625 nm to 675 nm. Any solid fluorescent dye that absorbs and emits the light in the specified wavelength range is possible.

In addition, in an embodiment, the solid fluorescent dye in the green color conversion layer CF2 absorbs light in a wavelength range from 425 nm to 475 nm, and emits light in a wavelength range from 525 nm to 575 nm. Any solid fluorescent dye that absorbs and emits the light in the specified wavelength range is possible.

A solid fluorescent dye according to an embodiment has an aggregated form. An average size of the aggregated solid fluorescent dye is about 100 nanometers or less, for example, from about 30 nanometers to about 40 nanometers.

According to an embodiment, an organic fluorescent dye provides excellent fluorescence efficiency in solution, but in a solid state, non-radiative processes, such as excimer formation or energy transfer, increase, so that the fluorescence efficiency rapidly decreases. A solid fluorescent dye according to an embodiment provides little fluorescence in solution, but intensity of the fluorescence thereof rapidly increases in the solid state.

According to an embodiment, the blue emission region B does not overlap a separate color conversion layer. The adhesive layer AL is disposed in the blue emission region B. The adhesive layer AL allows incident light to pass through as is.

According to an embodiment, the adhesive layer AL includes at least one of an optically clear adhesive (OCA), an optically clear resin (OCR), or a pressure sensitive adhesive (PSA), and specifically includes at least one of an acrylic compound, a silicone compound, or an acrylic-silicon hybrid compound. For example, the adhesive layer AL includes at least one of methyl methacrylate, styrene, or vinyltoluene, which provide a predetermined hardness. Alternatively, the adhesive layer AL includes at least one of methyl acrylate, ethyl acrylate, butyl acrylate, 2-ethylhexyl acrylate, or lauryl methacrylate. Further, the adhesive layer AL includes at least one of acrylamide, N-methyl acrylamide, hydroxyalkyl acrylate, such as 2-HEMA, HEA, HPMA, or HPA, glycidyl methacrylate, acrylic acid, methacrylic acid, itaconic acid, or maleic anhydride, which serve in a cross-linking role.

According to an embodiment, a storage modulus (C') of the adhesive layer AL is 0.2 MPa or less at −20° C. In addition, a glass transition temperature (Tg) of the adhesive layer (AL) is −30° C. or less. When the storage modulus and the glass transition temperature of the adhesive layer AL satisfy the above values, the adhesive layer AL easily bonds to the window WIN by providing a flat upper surface. In addition, since no other stacked structures are included between the color conversion layers CF1 and CF2 and the window WIN, time, cost, and materials can be reduced due to a simplified structure, and transmittance is increased.

In addition, according to an embodiment, the adhesive force of the adhesive layer AL is 600 gf/in or more with respect to a glass substrate or a plastic substrate, such as a polyimide substrate and a polyaramid substrate. Transmittance of the adhesive layer AL is 90% or more, and a haze value thereof is 5% or less.

According to an embodiment, the adhesive layer AL described above is highly planarized. Even without providing a separate transparent resin layer or a color conversion layer in the blue emission region B, the adhesive layer AL provides a transparent layer.

According to an embodiment, a thickness of the adhesive layer AL is from about 5 micrometers to about 50 micrometers. When the thickness of the adhesive layer AL is less than about 5 micrometers, it may not bond to the window WIN, the color conversion layers CF and CF2 and the light blocking member BM, and when the thickness of the adhesive layer AL is greater than about 50 micrometers, the flexibility of the display device decreases due to the increased thickness of the adhesive layer AL.

According to an embodiment, since a separate color conversion layer or resin layer is not disposed in the blue emission region B, a process for forming a blue color conversion layer can be omitted. A time and a cost of the process are therefore reduced.

A display device according to an embodiment includes the red color conversion layer CF1, the green color conversion layer CF2, the light blocking member BM, and the adhesive layer AL disposed in the blue emission region B. The light blocking member BM prevents light emitted from different color adjacent pixels from mixing, and partition regions in which the red color conversion layer CF, the green color conversion layer CF2, and the adhesive layer AL are disposed.

According to an embodiment, the adhesive layer AL is also disposed on the red color conversion layer CR, the green color conversion layer CF2, and the light blocking member BM. The adhesive layer AL overlaps not only the blue emission region B but also the red emission region R and the green emission region G. The adhesive layer AL overlaps an entire surface of the substrate SUB.

According to an embodiment, the adhesive layer AL directly contacts the red color conversion layer CF1 in the red emission region R, directly contacts the green color conversion layer CF2 in the green emission region G, and directly contacts the input sensing member TP in the blue emission region B. In addition, the adhesive layer AL directly contacts the light blocking member BM.

According to an embodiment, the window WIN is disposed on the adhesive layer AL. The window WIN protects the display device from external impacts, and provides an input surface to a user. The window WIN includes an externally exposed outer surface.

According to an embodiment, by including color conversion layers CF1 and CF2 disposed outside the display panel, the display device does not include a separate polarization layer. The color conversion layers CF1 and CF2 absorb external light, etc, thereby reducing reflection and improving display quality.

In addition, since a display device according to an embodiment does not include a separate color conversion layer or a transparent resin layer disposed in the blue emission region, the number of masks can be reduced, thereby reducing time and cost of a manufacturing process.

In addition, a display device according to an embodiment includes a flat adhesive layer without a separate flattening layer. Since the adhesive layer is substantially flexible, it helps to provide foldable, rollable, stretchable, slidable, or flexible display devices.

A circuit part PC according to an embodiment and a light emitting diode EL1 electrically connected thereto will be described with reference to FIG. 4. Descriptions of the same or similar components and contents as those described above may be omitted.

According to an embodiment, the circuit part PC disposed on the substrate SUB includes a buffer layer 111. The buffer layer 111 may include an inorganic insulating material such as silicon oxide, silicon nitride, or aluminum oxide, or an organic insulating material such as polyimide acryl. In some embodiments, the buffer layer 111 is omitted. The buffer layer 111 flattens one surface of the substrate SUB, or prevents moisture, impurities, etc. from diffusing through the circuit part PC to other layers.

According to an embodiment, a semiconductor layer 151 is disposed on the buffer layer 111. The semiconductor layer 151 may include an amorphous semiconductor, a polycrystalline semiconductor, or an oxide semiconductor.

According to an embodiment, the semiconductor layer 151 includes a source region 153 connected to a source electrode 173, a drain region 155 connected to a drain electrode 175, and a channel region 154 disposed between the source region 153 and the drain region 155.

According to an embodiment, a gate insulating film 140 is disposed on the semiconductor layer 151 and those portions of buffer layer 111 not covered by the semiconductor layer 151. The gate insulating film 140 may include an inorganic material, such as silicon nitride or silicon oxide, or an organic insulating material. Here, the silicon nitride may be, for example, SiNx or SiON, and the silicon oxide may be, for example, SiOx.

According to an embodiment, a gate electrode 124 is disposed on the gate insulating film 140. The gate electrode 124 overlaps the channel region 154 of the semiconductor layer 151.

According to an embodiment, an interlayer insulating film 160 is disposed on the exposed portions of the gate insulating film 140 and covers the gate electrode 124. The interlayer insulating film 160 may include an inorganic insulating material or an organic insulating material.

According to an embodiment, the source electrode 173 and the drain electrode 175 are disposed on the interlayer insulating film 160. Each of the source and drain electrodes 173 and 175 is respectively connected to the source region 153 and the drain region 155 of the semiconductor layer 151 through contact holes 163 and 165 that penetrate the interlayer insulating film 160 and the gate insulating film 140.

According to an embodiment, a planarization insulating film 180 is disposed on the source electrode 173, the drain electrode 175, and the exposed portions of interlayer insulating film 160. The planarization insulating film 180 may include an inorganic insulating material or an organic insulating material.

According to an embodiment, a pixel electrode 191, which is a first electrode, is disposed on the planarization insulating film 180. The pixel electrode 191 is connected to the drain electrode 175 through a contact hole that penetrates the planarization insulating film 180.

According to an embodiment, the partition wall PDL is disposed on the pixel electrode 191 and the planarization insulating film 180. The partition wall PDL overlaps at least a portion of the pixel electrode 191. The partition wall PDL has an opening 361 that exposes the pixel electrode 191. A light emitting layer 370 is disposed in the opening 361. A common electrode 270 is disposed on the light emitting layer 370 and the partition wall PDL. The encapsulation layer EN is disposed on the common electrode 270. The encapsulation layer EN may have a structure in which an organic film and an inorganic film are alternately stacked, or may have a structure such as the substrate SUB, but embodiments are not limited thereto. The pixel electrode 191, the light emitting layer 370, and the common electrode 270 form the first light emitting diode EL.

In some embodiments, the pixel electrode is an anode, which is a hole injection electrode, and the common electrode is a cathode, which is an electron injection electrode. However, in other embodiments, the pixel electrode is a cathode, and the common electrode is an anode. When holes and electrons are injected into the light emitting layer from the pixel electrode and the common electrode, respectively, the holes and electrons combine to form excitons, which are excited states, and light is emitted when the excitons decay back to a ground state.

Hereinafter, a structure of a rear surface of the substrate SUB will be described in more detail with reference to FIG.

5. Descriptions of the same components as the above-described components will be omitted.

A display device according to an embodiment further includes a protective film PF and a metal layer ML disposed on the rear surface of the substrate SUB. The protective film PF prevents external moisture from penetrating into the display device, and absorbs external impacts.

According to an embodiment, the protective film PF includes a protective layer PL and a cushion layer CL.

According to an embodiment, the protective layer PL includes a plastic film. For example, the protective layer PL includes at least one of polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), poly (arylene ether sulfone), or a combination thereof.

According to an embodiment, the protective layer PL includes the same material as the substrate SUB, but the substrate SUB has a higher heat resistance than the protective layer PL, and the protective layer PL is more flexible than the substrate SUB.

However, a material included in the protective layer PL is not limited to the above-described plastic resins, and in other embodiments, includes an organic/inorganic composite material. For example, the protective layer PL includes a porous organic layer and an inorganic material filled in the pores of the organic layer. The protective layer PL may further include a film-functional layer formed on the plastic film. The film-functional layer includes a resin layer. The film-functional layer is formed by a coating method.

According to an embodiment, the cushion layer CL absorbs physical impacts applied to the display device. In addition, the cushion layer CL may have a protrusion-depression structure or an embossed structure, etc., for impact absorption.

An embodiment in which the cushion layer CL is formed as a single layer is illustrated in FIG. 5, but embodiments of the present disclosure are not limited thereto, and in other embodiments, the cushion layer CL is formed as a multilayer structure.

According to an embodiment, the cushion layer CL includes any material that can absorb an impact. The cushion layer CL may include a polymer resin, such as, for example, polyurethane, polycarbonate, polypropylene, polyimide, or polyethylene, or it may include a rubber liquid, a urethane-based material, or a sponge obtained by foam-molding an acrylic-based material.

According to an embodiment, the metal layer ML is disposed on a rear surface of the protective film PF. The metal layer ML overlaps an entire surface of the protective film PF.

According to an embodiment, the metal layer ML is relatively thin, and helps the display device maintain a fixed shape when foldable or flexible.

According to an embodiment, adhesive layers A1, A2, and A3 are disposed between the substrate SUB and the protective layer PL, between the protective layer PL and the cushion layer CL, and between the cushion layer CL and the metal layer ML, respectively. The adhesive layers A1, A2, and A3 attach two adjacent layers. For example, the adhesive layers A1, AZ, and A3 include one of an optically clear adhesive (OCA), an optically clear resin (OCR), or a pressure sensitive adhesive (PSA).

Figure 6:
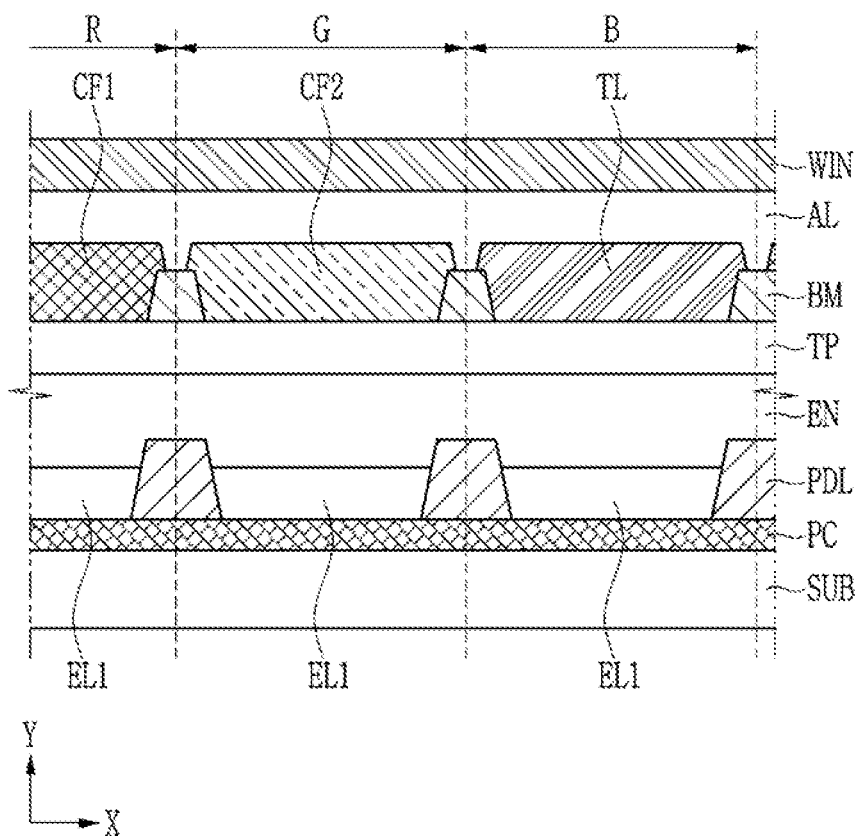
FIGS. 6, 7, and 8 are cross-sectional views of a display device according to an embodiment.
Figure 7:
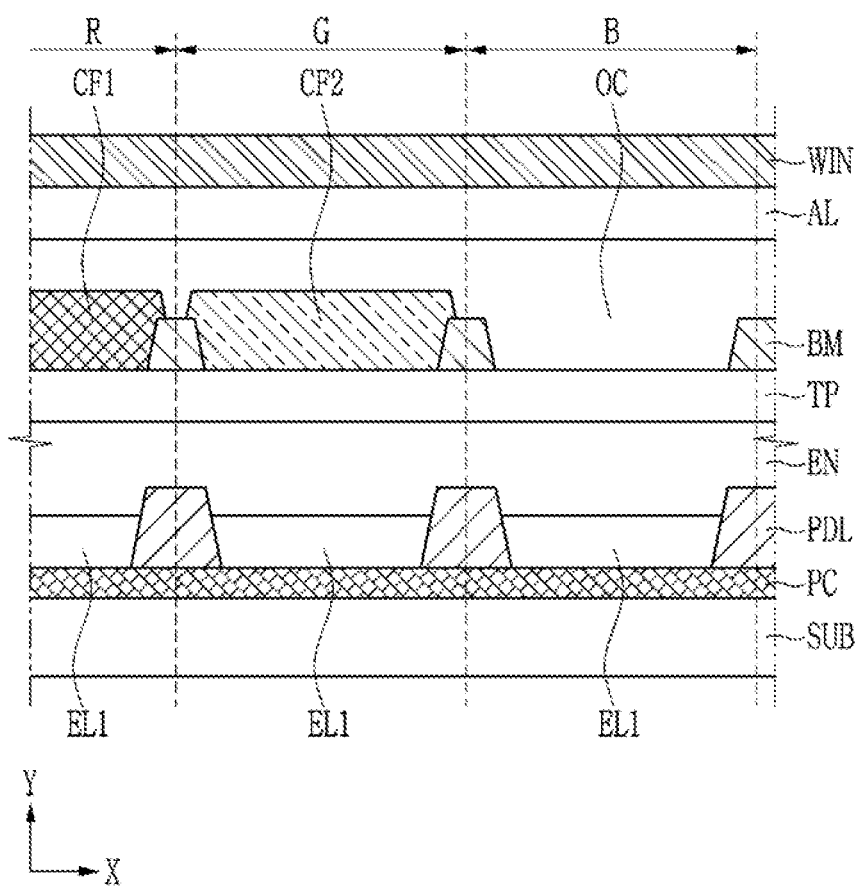
Figure 8:
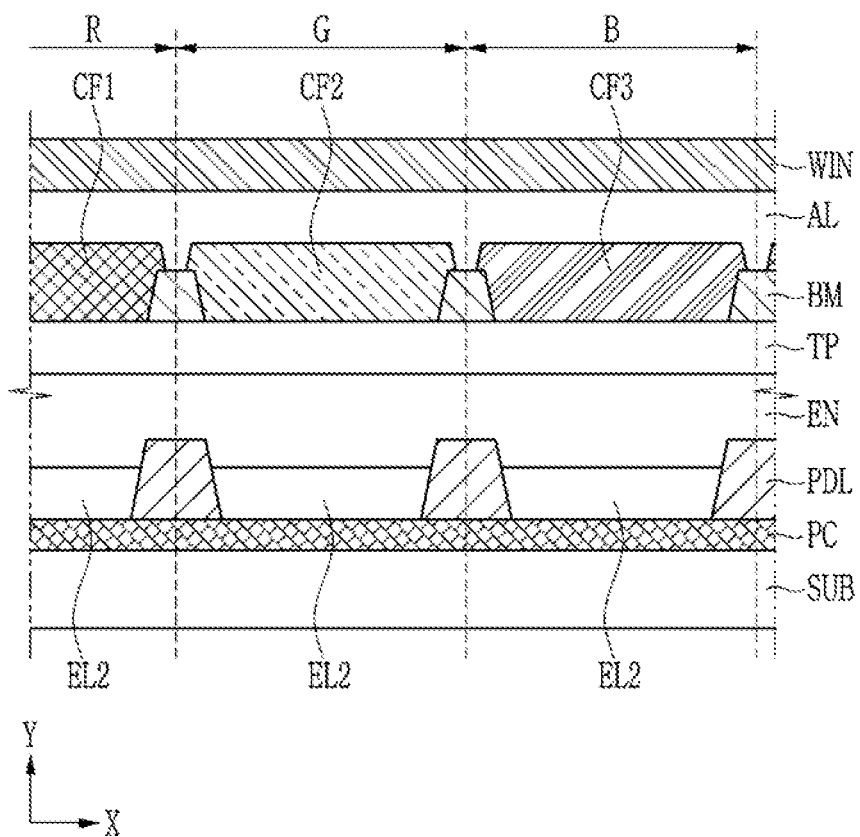

Hereinafter, a display device according to an embodiment will be described with reference to FIGS. 6, 7, and 8. FIGS. 6, 7, and 8 are cross-sectional views of a display device, respectively. Descriptions of the same components as the above-described components will be omitted.

First, referring to FIG. 6, according to an embodiment, a display device according to an embodiment includes a transparent layer TL disposed in the blue emission region B. The transparent layer TL allows blue light emitted from the first light emitting diode EL1 to pass through as is.

According to an embodiment, the transparent layer TL is formed through a patterning process. The transparent layer TL can include any material that can be patterned, and, for example, include a transparent negative photosensitive resin composition. For example, the transparent layer TL includes a transparent acrylic resin composition. The transparent layer TL is formed by a photo-curing (UV) process, or by applying a photo-curing process and a thermosetting process together.

According to an embodiment, the adhesive layer AL is disposed on the red color conversion layer CF1, the green color conversion layer CF2, the transparent layer TL, and the light blocking members BM. The adhesive layer AL bonds the window WIN to the red color conversion layer CF1, the green color conversion layer CF2, the transparent layer TL, and the light blocking members BM.

According to an embodiment, the adhesive layer AL directly contacts upper surfaces of the red color conversion layer CF1, the green color conversion layer CF2, the transparent layer TL, and the light blocking members BM. Although there are steps between the red color conversion layer CF1, the green color conversion layer CF2, the transparent layer TL, and the light blocking members BM, the adhesive layer provides a planarized top surface thereon.

Next, referring to FIG. 7, a display device according to an embodiment includes an overcoat layer OC that overlaps the blue emission region B. The overcoat layer OC is transparent and transmits blue light emitted from the first light emitting diode EL1 as is.

The overcoat layer OC according to an embodiment includes a transparent photosensitive resin composition, which, for example, includes an acrylic resin composition. The overcoat layer OC is formed through a thermosetting process or a photo-curing process.

According to an embodiment, the overcoat layer OC overlaps an entire surface of the substrate SUB, and specifically, the overcoat layer OC overlaps the red color conversion layer CF1, the green color conversion layer CF2, the light blocking member BM and the input sensing member TP. The overcoat layer OC overlaps the red emission region R, the green emission region G, and the blue emission region B. A thickness of the overcoat layer OC that overlaps the red emission region R and the green emission region G differs from a thickness of the overcoat layer OC that overlaps the blue emission region B. The thickness of the overcoat layer OC that overlaps the red emission region R and the green emission region G is less than that of the overcoat layer OC that overlaps the blue emission region B. The overcoat layer OC in the red emission region R and the green emission region G is disposed between the red color conversion layer CF1 and the adhesive layer AL and between the green color conversion layer CF2 and the adhesive layer AL, while the overcoat layer OC in the blue emission region B is disposed between the input sensing member TP and the adhesive layer AL.

The adhesive layer AL according to an embodiment is disposed between the overcoat layer OC and the window WIN. The adhesive layer AL directly contacts an upper surface of the overcoat layer OC. The overcoat layer OC provides a relatively flat upper surface, and the adhesive layer AL is disposed thereon with substantially the same thickness. The window WIN according to an embodiment is attached to the overcoat layer OC by the adhesive layer AL.

Next, referring to FIG. 8, a display device according to an embodiment includes a second light emitting diode EL2 connected to the circuit part PC. The second light emitting diode EL2 emits light in an ultraviolet wavelength band, for example, in a wavelength band from about 350 nanometers to 370 nanometers.

According to an embodiment, the red color conversion layer CF1 disposed in the red emission region R converts light in the ultraviolet wavelength band received from the second light emitting diode EL2 into red light and emits it. The green color conversion layer CF2 disposed in the green emission region C converts light in the ultraviolet wavelength band received from the second light emitting diode EL2 into green light and emits it. The blue color conversion layer CF3 disposed in the blue emission region B converts light in the ultraviolet wavelength band received from the second light emitting diode EL2 into blue light and emits it.

According to an embodiment, each of the red color conversion layer CF1, the green color conversion layer CF2, and the blue color conversion layer CF3 includes quantum dots or a solid fluorescent dye that convert ultraviolet light into light in a specific wavelength band. Examples of quantum dots have been described above.

In an embodiment, a solid fluorescent dye is included in the red color conversion layer CF1 that absorbs light in a wavelength range of 340 nm to 400 nm and emits light in a wavelength range of 625 nm to 675 nm. Any solid fluorescent dye that absorbs and emits the light in the wavelength range as described above is suitable.

In addition, in an embodiment, a solid fluorescent dye is included in the green color conversion layer CF2 that absorbs light in a wavelength range of 340 nm to 400 nm, and in this case, emits light in a wavelength band of 525 nm to 575 nm. Any solid fluorescent dye that absorbs and emits the light in the wavelength range as described above is suitable.

In an embodiment, a solid fluorescent dye is included in the blue color conversion layer CF3 that absorbs light in a wavelength range of 340 nm to 400 nm and emits light in a wavelength band of 425 nm to 475 nm. Any solid fluorescent dye that absorbs and emits the light in the wavelength range as described above is suitable.

According to an embodiment, the adhesive layer AL directly contacts the red color conversion layer CF1, the green color conversion layer CF2, the blue color conversion layer CF3, and the light blocking members BM. The adhesive layer AL bonds the window WIN to the red color conversion layer CF1, the green color conversion layer CF2, the blue color conversion layer CF3, and the light blocking members BM. Although there are steps between the red color conversion layer CF1, the green color conversion layer CF2, the blue color conversion layer CF3, and the light blocking members BM, the adhesive layer AL provides a substantially flat upper surface. The bonding of the adhesive layer AL and the window WIN will be stable.

While embodiments of this disclosure have been described in connection with what is presently considered to be exemplary embodiments, it is to be understood that embodiments of the disclosure are not limited to exemplary embodiments, but, on the contrary, are intended to cover various modifications and equivalent arrangements included within the spirit and scope of the appended claims.

What is claimed is:

1. A display device comprising:
a light emitting diode;
an input sensing member disposed on the light emitting diode;
a red emission region, a green emission region, and a blue emission region;
a color conversion layer and a light blocking member disposed on the input sensing member, wherein the color conversion layer includes a red color conversion layer that overlaps the red emission region, and a green color conversion layer that overlaps the green emission region;
an adhesive layer disposed on the color conversion layer and the light blocking member, wherein the adhesive layer directly contacts the input sensing member in the blue emission region; and
a window bonded to the adhesive layer,
wherein a storage modulus of the adhesive layer is 0.2 MPa or less at −20° C., and a glass transition temperature (Tg) of the adhesive layer is −30° C. or less, and
the adhesive layer includes at least one of vinyltoluene, lauryl methacrylate, acrylamide, N-methyl acrylamide, hydroxyalkyl acrylate, acrylic acid, taconic acid, or maleic anhydride.

2. The display device of claim 1, wherein
the red color conversion layer and the green color conversion layer each include at least one of quantum dots or a solid fluorescent dye.

3. The display device of claim 1, wherein
the adhesive layer directly contacts the red color conversion layer in the red emission region, and
the adhesive layer directly contacts the green color conversion layer in the green emission region.

4. The display device of claim 1, further comprising:
a substrate;
a circuit part disposed on the substrate, wherein the light emitting diode is disposed on the circuit part; and
an encapsulation layer disposed on the light emitting diode and the circuit part;
wherein the input sensing member is disposed on the encapsulation layer, and
the substrate is flexible.

5. The display device of claim 1, further comprising
a transparent layer disposed in the blue emission region but not in the red emission region or the green emission region.

6. The display device of claim 5, wherein
the adhesive layer contacts upper surfaces of the color conversion layer and the transparent layer.

7. The display device of claim 1, further comprising
an overcoat layer that overlaps the blue emission region.

8. The display device of claim 7, wherein
the overcoat layer directly contacts the input sensing member, and
the adhesive layer is disposed between the overcoat layer and the window.

9. The display device of claim 1, wherein the color conversion layer further chides a blue color conversion layer that overlaps the blue emission region.

10. The display device of claim 9, wherein
the blue color conversion layer includes at least one of quantum dots or a solid fluorescent dye, and
the light emitting diode emits ultraviolet light.

11. A display device comprising:
an encapsulation layer;
a red emission region, a green emission region, and a blue emission region;
a color conversion layer and a light blocking member disposed on the encapsulation layer, wherein the color conversion layer includes a red color conversion layer that overlaps the red emission region, and a green color conversion layer that overlaps the green emission region;
an input sensing member disposed between the encapsulation layer and the color conversion layer;
an adhesive layer disposed on the color conversion layer and the light blocking member, wherein the adhesive layer directly contacts the input sensing member in the blue emission region; and
a window bonded to the adhesive layer,
wherein the adhesive layer includes at least one of vinyltoluene, lauryl methacrylate, acrylamide, N-methyl acrylamide, hydroxyalkyl acrylate, acrylic acid, itaconic acid, or maleic anhydride, and
the adhesive layer contacts the color conversion layer and the light blocking member.

12. The display device of claim 11, wherein
a storage modulus of the adhesive layer is 0.2 MPa or less at −20° C., and a glass transition temperature (Tg) of the adhesive layer is −30° C. or less.

13. The display device of claim 11, wherein
an adhesive force of the adhesive layer is 600 gf/in or more, a transmittance of the adhesive layer is 90% or more, and a haze value of the adhesive layer is 5% or less.

14. The display device of claim 11, wherein
the adhesive layer directly contacts the red color conversion layer in the red emission region, and
the adhesive layer directly contacts the green color conversion layer in the green emission region.

15. The display device of claim 11, further comprising:
a substrate; and
a circuit part and a light emitting diode disposed on the substrate,
wherein the encapsulation layer is disposed on the circuit part and the light emitting diode.

16. A display device comprising:
a light emitting diode;
a color conversion layer and a light blocking member disposed on the light emitting diode, wherein the display device includes a red emission region, a green emission region, and a blue emission region;
an adhesive layer disposed on the color conversion layer and the light blocking member; and
a window bonded to the adhesive layer,
wherein an adhesive force of the adhesive layer is 600 gf/in or more, a transmittance of the adhesive layer is 90% or more, and a haze value of the adhesive layer is 5% or less, and
the adhesive layer includes at least one of vinyltoluene, lauryl methacrylate, N-methyl acrylamide, hydroxyalkyl acrylate, acrylic acid, itaconic acid, or maleic anhydride.

* * * * *